(12) United States Patent
Zhou (10) Patent No.: US 8,482,330 B2
(45) Date of Patent: Jul. 9, 2013

(54) TEMPERATURE SENSING CIRCUIT AND METHOD

(75) Inventor: Yi Zhou, San Ramon, CA (US)

(73) Assignee: Accusilicon Inc., George Town, Grand Cayman (KY)

( * ) Notice: Subject to any disclaimer, the term of this patent is extended or adjusted under 35 U.S.C. 154(b) by 945 days.

(21) Appl. No.: 12/574,815

(22) Filed: Oct. 7, 2009

(65) Prior Publication Data

US 2011/0080200 A1 Apr. 7, 2011

(51) Int. Cl.
*H03H 11/26* (2006.01)

(52) U.S. Cl.
USPC .......................................... 327/262

(58) Field of Classification Search
USPC .......................................... 327/262
See application file for complete search history.

(56) References Cited

U.S. PATENT DOCUMENTS 6,217,213 B1 * 4/2001 Curry et al. ................... 374/178

* cited by examiner

*Primary Examiner* — Daniel Rojas (57) ABSTRACT

A low cost, low power and low noise temperature sensor circuit is disclosed. A control circuit asserts a start signal and a stop signal, causes a pulse generating circuit to generate a finite number of pulses, whose pulse frequency varies with temperature. A counter counts the finite number of pulses and outputs the count which can be used to represents the temperature. Further, the pulse generating circuit includes a delay circuit, a pulse width controlling circuit, and a synchronizer with asynchronous clear.

18 Claims, 7 Drawing Sheets

TEMPERATURE SENSING CIRCUIT AND METHOD

CROSS-REFERENCE TO RELATED APPLICATIONS

Not applicable

STATEMENT REGARDING FEDERALLY SPONSORED RESEARCH OR DEVELOPMENT

Not applicable

BACKGROUND a) Field of the Invention

The present invention generally relates to integrated circuits, and more specifically, to a temperature sensor for an integrated circuit.

b) Background

Temperature sensing has been widely used in integrated circuits.

One example is a temperature compensated crystal oscillator (TCXO). A temperature sensor is used to compensate the crystal oscillator so the crystal oscillator's frequency is much more stable under a environment with varying temperature than a crystal oscillator without a temperature compensation scheme. Temperature compensated crystal oscillators have been widely used in commercial digital communications applications.

Another example is a microprocessor using a integrated temperature sensor to sense the die temperature in order to prevent the microprocessor from overheating and thus cause malfunctioning. As the clock frequency of a microprocessor increases, the microprocessor's self-heating issues becomes more and more important.

Yet another example of using a integrated temperature sensor is a DRAM chip. A DRAM chip needs to adjust its refresh period based on sensed chip temperature in order to avoid data loss.

Yet another use of a temperature sensor is for the temperature control of consumer electronics, such as home electronics and automobiles.

A typical integrated temperature sensor utilizes a temperature sensing diode to generate a temperature dependent voltage, then uses an analog-to-digital converter (ADC) to convert the temperature dependent voltage into digital form so that the temperature can be calculated. However, an analog-to-digital converter usually consume a fairly large chip space and fairly large power, and its circuitry is rather complex. Furthermore, the accuracy of the analog-to-digital converter is often affected by digital switching noises, and self heating.

Hence, a need exists to provide a low cost, high accuracy integrated temperature sensor, whose power consumption should be minimized to be applicable on battery powered portable electronic devices like cellular phones, PDAs and laptops.

SUMMARY OF THE INVENTION

A primary object of the present invention is to detect the operating temperature in a integrated circuit while consuming very little power, and producing very little noise.

Another object of the present invention is to provide a temperature sensor that is easy to design and manufacture.

In one embodiment of the present invention, a temperature sensor includes a control circuit, a pulse generating circuit and a counter. The pulse generating circuit includes a delay circuit, a pulse width controlling circuit and a synchronizer. The control circuit passes a start signal, causes the pulse generating circuit to a series of pulses, whose pulse frequency varies with temperature. Then control circuit passes a stop signal, causes the pulse generating circuit to substantially stop generating the pulses. The counter count the number of pulses during an approximately predetermined time frame after the start signal and output the number that can be used to represent the temperature.

Further, in the above embodiment, the delay circuit, the pulse width controlling circuit and the synchronizer forms a pulse generating circuit that can be turned on and off substantially instantly. During the period between a stop signal and the following start signal, the pulse generating circuit is put into a power-saving mode and consumes virtually no power and stays substantially quiet.

Further, in the above embodiment, the delay circuit and the pulse width controlling circuit may be realized by serially connected inverters. The above embodiment can be realized by digital logic elements, which is easy to design and manufacture.

The foregoing and other objects, features and advantages of the present invention will become more readily apparent for those skilled in the art after referring to the following detailed description and accompanying drawings, wherein is shown and described only the preferred embodiments of the present invention, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE INVENTION

Figure 1:
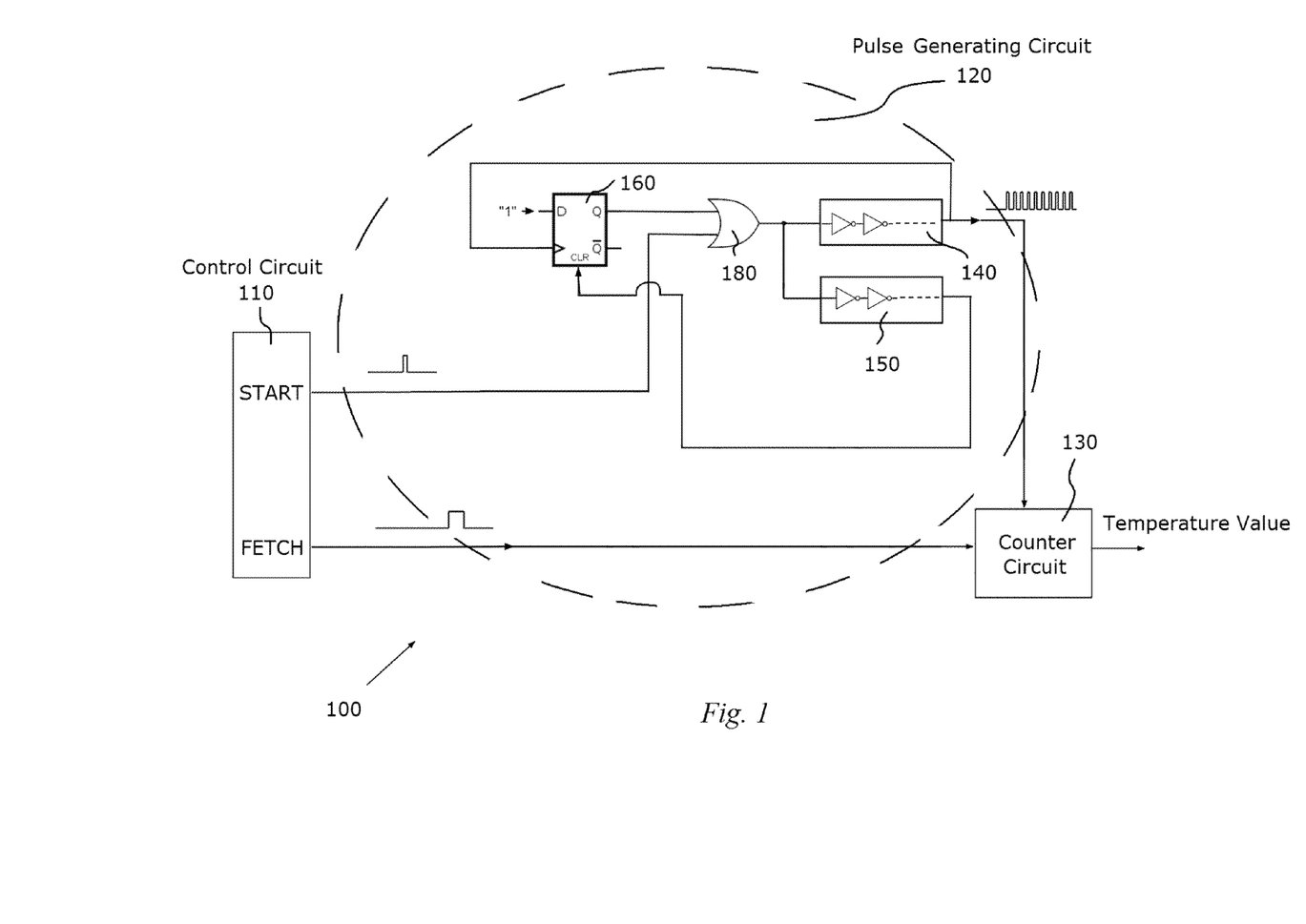
FIG. 1 shows a block diagram of one embodiment of a temperature sensor of the present invention.

FIG. 1 shows a block diagram of one embodiment of a temperature sensor 100 of the present invention. The temperature sensor 100 comprises a control circuit 110, a pulse generating circuit 120 and a counter circuit 130. The pulse generating circuit 120 comprises a D flip-flop 160 with asynchronous clear, an OR gate 180, a delay circuit 140 and a pulse width controlling circuit 150. The propagation delay time of the pulse width controlling circuit 150 td2 is designed to be about half of the propagation delay time of the delay circuit 140 td1. The control circuit 110 issues a START signal as a short pulse, and then, after a predetermined time interval T1, issues a FETCH signal. The counter circuit 130 is coupled to the pulse generating circuit 120 and the control circuit 110 with a initial count, zero for example. The data input of the D flip-flop 160 is tied to logic "1". When the control circuit 110 issues a START signal, the D flip-flop 160 will sense the rising edge of the START signal and a logic "1" will be generated at its output, meanwhile a logic "1" will be generated at the input of the delay circuit 140 through the OR gate 180. After a td2 time delay, the pulse width controlling circuit 150 will output the logic "1", which will clear the D flip-flop 160 and create a logic "0" at its output, causing a logic "0" signal appears at the input of the delay circuit 140 and the input of the pulse width controlling circuit 150. After a (td1-td2) time delay, the delay circuit 140 will output the logic "1", and trigger the D flip-flop 160 to output logic "1", and so on and so on. At the output of the delay circuit 140, a series of 1-0-1-0-1-0 . . . pulses is formed, with the pulse width of approximately td2 and pulse period of approximately td1. The delay circuit 140 may comprise a number of serially connected inverter pairs, whose propagation delay varies with temperature. So the propagation delay time td1 of the delay circuit 140 also varies with temperature. When temperature is high, td1 becomes larger, when temperature is low, td1 becomes smaller. The counter circuit 130 counts the number of pulses received from the output of the delay circuit 140, and when the control circuit 110 issues a FETCH signal, the counter circuit 130 out put its count value COUNT. COUNT roughly equals to T1/td1. Since T1 is a predetermined time interval, so COUNT=T1/td1 also varies with temperature and can be used to represent temperature information. When temperature is high, COUNT becomes smaller, when temperature is low, COUNT becomes larger. For example, the counter circuit 130 may report a count of 6781 at 85 degrees Fahrenheit and 7035 at 32 degrees Fahrenheit. These numbers are for illustration only. The present invention is not limited to any number for any temperature or temperature range.

Referring to FIG. 1, there are many ways to design the control circuit 110 to generate the START signal and FETCH signal, for example, those skilled in the art may use a reference internal or external clock, and divided the clock to generate the above signals, or they may use a microprocessor and program it to generate the above signals, or use finite state machine circuit to generate the above signals, or even use a RC pulse generator and some pulse shaping circuit to generate the above signals.

Referring to FIG. 1, the counter circuit 130 may further include storage elements such as registers to store the count. The counter circuit 130 may have means to output the count in serial or in parallel.

Figure 2:
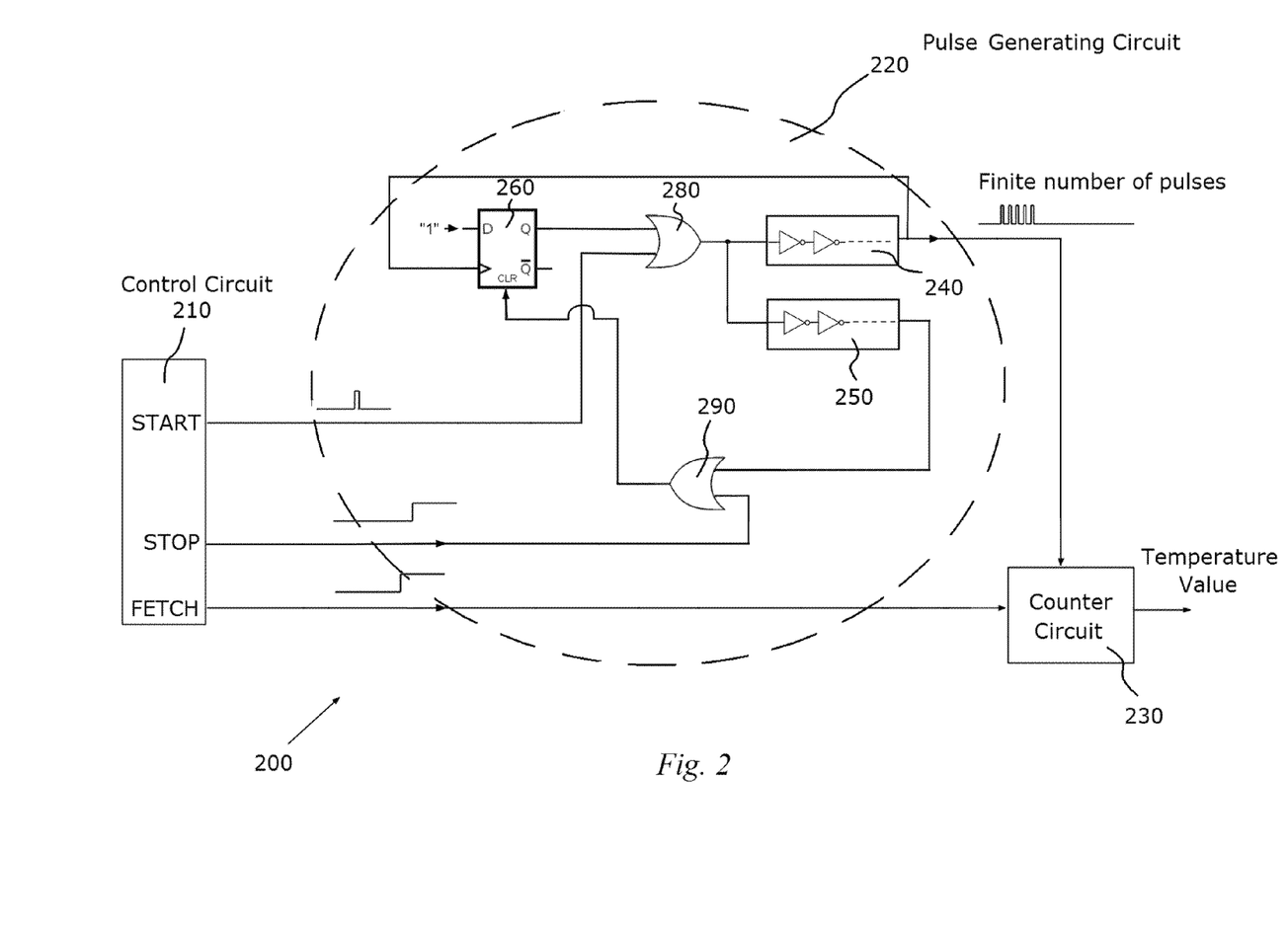
FIG. 2 shows a block diagram of another embodiment of a temperature sensor of the present invention.

FIG. 2 shows a block diagram of another embodiment of a temperature sensor 200 of the present invention. The temperature sensor 200 is a further improvement of the embodiment 100 of FIG. 1. This temperature sensor 200 is designed to consume very low power and generate very low noise which is desirable for battery powered hand-held electronic devices, noise sensitive electronic devices such as temperature compensated crystal oscillators widely used in radio communications.

In many situations, temperature varies relatively slowly, for example, temperature may vary slower than 1 degree Fahrenheit per second in many situations. So temperature sensing doesn't have to always be done continuously. If temperature varies at a maximum rate of 1 degree Fahrenheit per second, and only 1 degree Fahrenheit accuracy is needed, temperature sensing can be done once every one-tenth second, and a measuring period of one millisecond is long enough for the temperature sensor 200 to generate a temperature reading. For the rest of the time, the temperature sensor 200 may be put in a power-saving mode and consumes virtually no power.

Referring to FIG. 2, the temperature sensor 200 comprises a control circuit 210, a pulse generating circuit 220 and a counter circuit 230. The pulse generating circuit 220 comprises a D flip-flop 260 with asynchronous clear, a first OR gate 280, a second OR gate 290, a delay circuit 240 and a pulse width controlling circuit 250. The propagation delay time td4 of the pulse width controlling circuit 250 is designed to be about half of the propagation delay time td3 of the delay circuit 240. The control circuit 210 issues a START signal as a short pulse, and then, after a predetermined time interval T2, issues a FETCH signal, then after a time interval T3, issues a STOP signal. The counter circuit 230 is coupled to the pulse generating circuit 220 and the control circuit 210 with a initial count of zero. The data input of the D flip-flop 260 is tied to logic "1". When the control circuit 210 issues a START signal, the D flip-flop 260 will sense the rising edge of the START signal and generate a logic "1" at its output, meanwhile a logic "1" will be generated at the input of the delay circuit 240 by the first OR gate 280. After a td4 time delay, the pulse width controlling circuit 250 will output the logic "1", which will clear the D flip-flop 260 by the second OR gate 290 and create a logic "0" at its output, this will cause a logic "0" signal appears at the input of the delay circuit 240 and the pulse width controlling circuit 250. After a (td3-td4) time delay, the delay circuit 240 will output the logic "1", and trigger the D flip-flop 260 to output logic "1" again, and so on and so on. At the output of the delay circuit 240, a series of 1-0-1-0-1-0 . . . pulses is formed, with the pulse width of approximately td4 and pulse period of approximately td3. The delay circuit 240 may comprise a number of serially connected inverter pairs, whose propagation delay varies with temperature. So the propagation delay time td3 of the delay circuit 240 also varies with temperature. When temperature is high, td3 becomes larger, when temperature is low, td3 becomes smaller. The counter circuit 230 counts the number of pulses received from the output of the delay circuit 240, and when the control circuit 210 issues a FETCH signal, the counter circuit 230 out put its count value COUNT. COUNT roughly equals to T2/td3. Since T2 is a predetermined time interval, so COUNT=T2/td3 also varies with temperature and can be used to represent temperature information. When temperature is high, COUNT becomes smaller, when temperature is low, COUNT becomes larger. The STOP signal is used to clear the D flip-flop 260 through the second OR gate 290. So after the control circuit 210 issues a STOP signal, the D flip-flop 260 and the delay circuit 240 can be cleared, so the delay circuit 240 will only output logic "0" after the STOP signal issued, so the pulse generating circuit 220 will substantially no longer generate pulses until the control circuit 210 issues a next START signal.

During the time between a STOP signal and the following START signal, the temperature sensor 200 is said being put into power-saving mode: The pulse generating circuit 220 produces substantially no pulse during this period and the counter circuit 230 does not perform count during this period, therefore, the temperature sensor 200 consumes virtually no power in power-saving mode. There are other benefits of the embodiment of FIG. 2: One benefit is that putting the temperature sensor 200 into power-saving mode not only saves power, but also reduces self-heating of the temperature sensor 200, thus reduces the sensing error caused by the self-heating of the temperature sensor 200. Another benefit is that putting the temperature sensor 200 into power-saving mode substantially reduces the switching noise generated by the temperature sensor 200 since there's substantially no signal oscillating during the power-saving mode, and the temperature sensor 200 does not have a free running oscillator.

Variations can be made upon the embodiment of FIG. 2. For example, the STOP signal and the FETCH signal can be merged. For another example, the counter circuit 230 can be designed in a way that can detect the pause of pulses from the pulse generating circuit 220 and then generate a count value without a FETCH signal. Of course, the present invention is not limited to the preferred embodiments described in FIG. 1 and FIG. 2. Rather, various changes may be made without departing the spirit of this invention.

Figure 3:
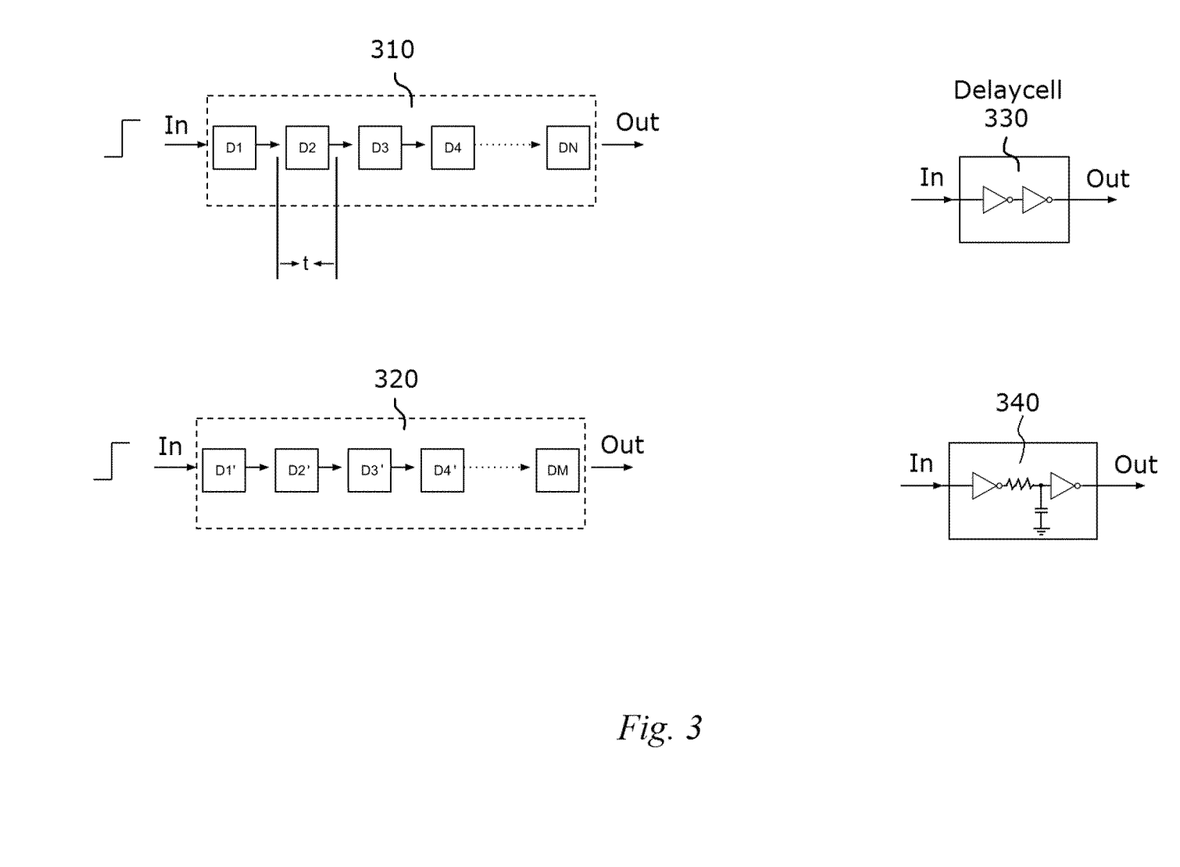
FIG. 3 shows a detailed diagram of an embodiment of a delay circuit and a pulse width control circuit that can be used in the present invention.

FIG. 3 is a detail illustration of the delay circuits (140, 240) and pulse width controlling circuits (150, 250) used in FIG. 1 and FIG. 2. The first delay circuit 310 is a detailed illustration of the delay circuit 140 in FIG. 1 and the delay circuit 240 in FIG. 2. Referring to FIG. 3, the first delay circuit 310 is a temperature dependent delay line, which may comprise N serially connected delay cells 330. Each delay cell 330 comprises a pair of serially connected inverters. The propagation delay time of the delay cells 330 increases as the temperature of the delay cells 330 increases and the propagation delay time of the delay cells 330 decreases as the temperature of the delay cells 330 decreases, therefor, the whole propagation delay time of the first delay circuit 310 varies with the temperature of the first delay circuit 310, and therefore, the first delay circuit can be used to sense temperature. Using serially connected inverters to generate the temperature dependent delay is a low cost solution in CMOS integrated circuits, however, other logic elements may also be used as the basic delay element without departing from the spirit of the present invention. The number of the delay cells N in the first delay circuit 310 determines the pulse frequency of the pulse generating circuit 120 in FIG. 1 or the pulse frequency of the pulse generating circuit 220 in FIG. 2. For a given measuring time interval, a higher pulse frequency produces better accuracy in temperature sensing.

Referring to FIG. 3, the second delay circuit 320 is another delay circuit that is used as the pulse width controlling circuit 150 in FIG. 1 and the pulse width controlling circuit 250 in FIG. 2. The second delay circuit 320 may comprise M serially connected delay cells. The propagation delay time of the second delay circuit 320 is preferably designed to be about half of the propagation delay time of the first delay circuit 310. In CMOS integrated circuits, serially connected inverters are usually used in delay circuits. However, one skilled in the art will recognize that there are other ways to create a delay circuit, for example, one can use an alternative delay cell 340 that includes a resistor and a capacitor. Other variations of delay cells and delay circuits are within the scope of the present invention.

Figure 3B:
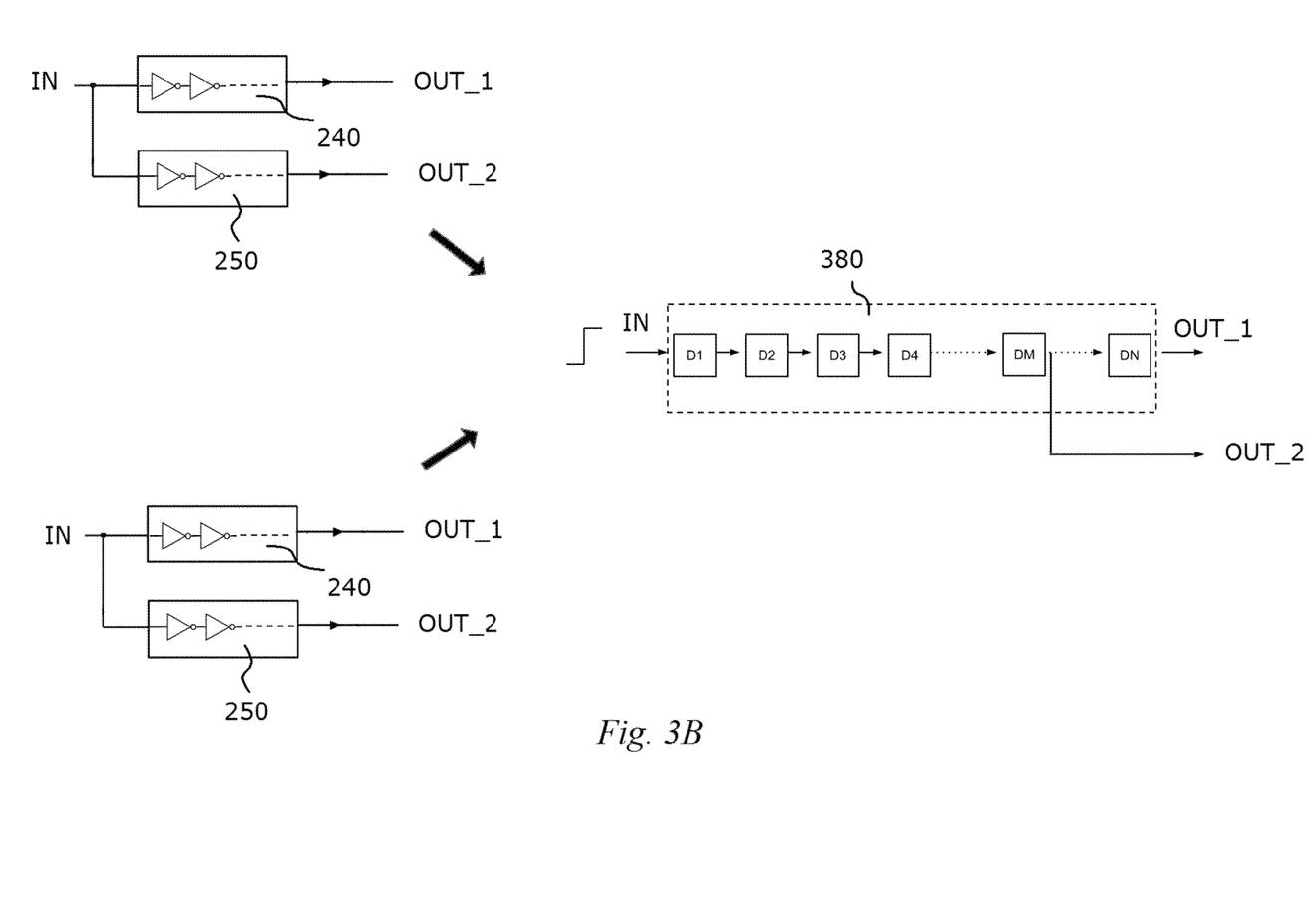
FIG. 3B shows a way to design a delay circuit and a pulse width control circuit by sharing some delay elements.

FIG. 3B shows a way to design the delay circuit 140 and the pulse width controlling circuit 150 of FIG. 1 by sharing some delay elements. Since both the delay circuit 140 and the pulse width controlling circuit 150 can be designed using serially connected delay elements, and they share the same input signal, those skilled in the art can let the delay circuit 140 and the pulse width controlling circuit 150 of FIG. 1 share some delay element and design a delay circuit 380. The delay circuit 380 comprises N serially connected delay elements. The output of the last delay element DN is assigned to the output of the delay circuit 140, and the output of the Mth (M<N) delay element is assigned to the output of the pulse width controlling circuit 150. The delay circuit 240 and the pulse width controlling circuit 250 of FIG. 2 can also use the same delay element sharing circuit like the delay circuit 380.

Figure 4:
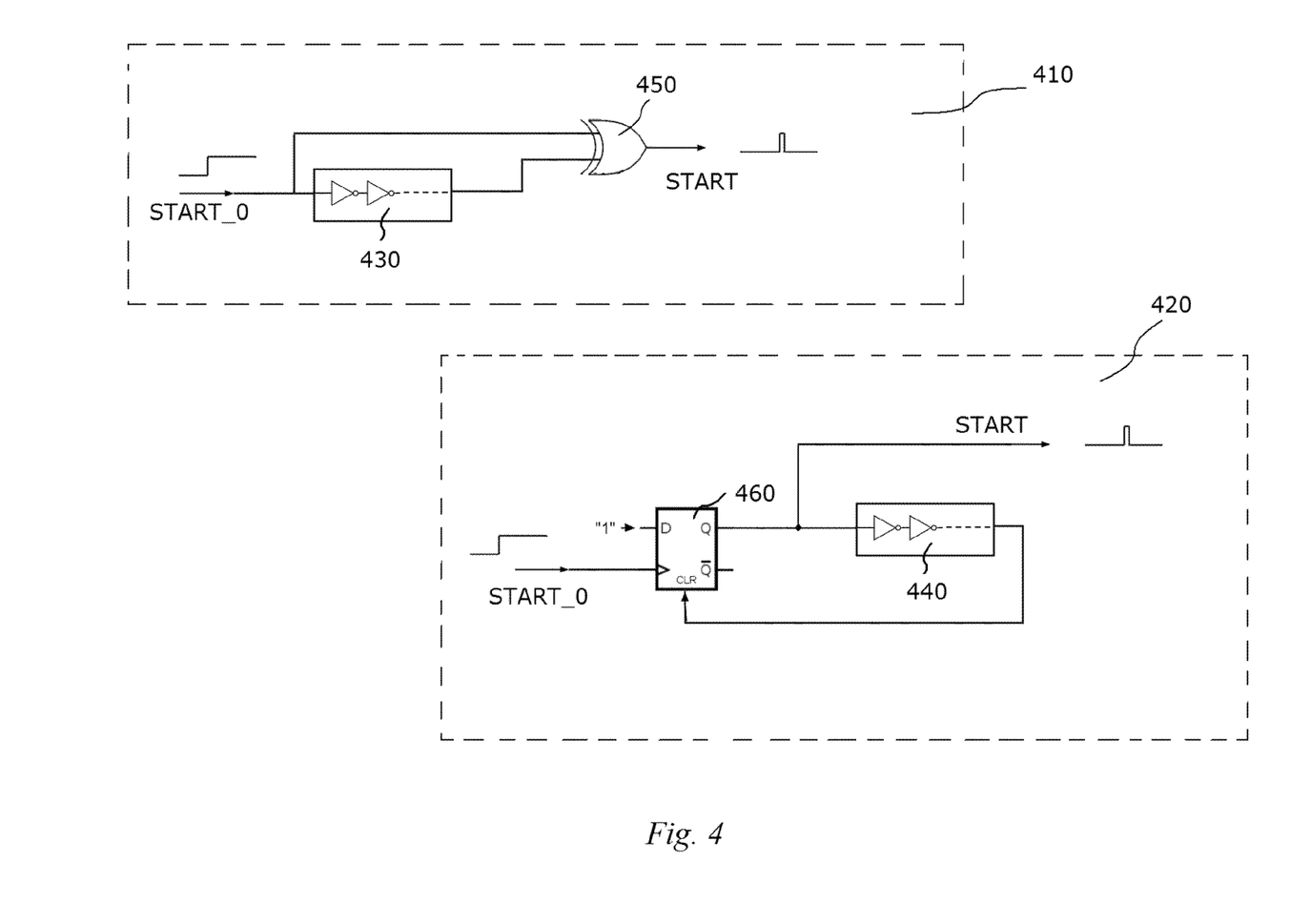
FIG. 4 shows two detailed start signal generating circuits that can be used in the present invention.

FIG. 4 illustrated two examples of start signal generating circuit which can be used in the control circuit 110 in FIG. 1 and the control circuit 210 in FIG. 2: 410 and 420. Referring to FIG. 4, the first start signal generating circuit 410 may comprise a delay circuit 430 and an XOR gate 450 to convert the input logic signal (START_0) into a short pulse signal (START), in order to start the pulse generating circuit 120 in FIG. 1 or to start the pulse generating circuit 220 in FIG. 2. Referring to FIG. 4, the second start signal generating circuit 420 may comprise a delay circuit 440 and a D flip-flop 460 with asynchronous clear. The data input of the D flip-flop 460 is tied to logic "1". the second start signal generating circuit 420 can also convert the input logic signal (START_0) into a short pulse signal (START), in order to start the pulse generating circuit 120 in FIG. 1 or to start the pulse generating circuit 220 in FIG. 2. When the second start signal generating circuit 420 is used in the embodiment of FIG. 1, the delay circuit 440 may be configured to share the delay circuit 150 of FIG. 1. When the second start signal generating circuit 420 is used in the embodiment of FIG. 2, the delay circuit 440 may be configured to share the delay circuit 250 of FIG. 2.

Referring to FIG. 4, the delay circuit 430 may be realized by serially connected inverters, the purpose of the delay circuit 430 is to introduce a delay, for example, a few nanoseconds between the input signal of the delay circuit 430 and the output of the delay circuit 430. Using serially connected inverters to generate the delay is a low cost solution in CMOS integrated circuits. For the same reason, the delay circuit 440 can also be realized by serially connected inverters. However, one skilled in the art will recognize that there are other ways to create a short pulse START signal.

Referring to FIG. 4, the propagation delay time of the delay circuit 430 or the delay circuit 440 is preferably designed to be about half of the propagation delay time of the delay circuit 140 of FIG. 1 if the embodiment of FIG. 1 is used, or to be about half of the propagation delay time of the delay circuit 240 of FIG. 2 if the embodiment of FIG. 2 is used.

Figure 5:
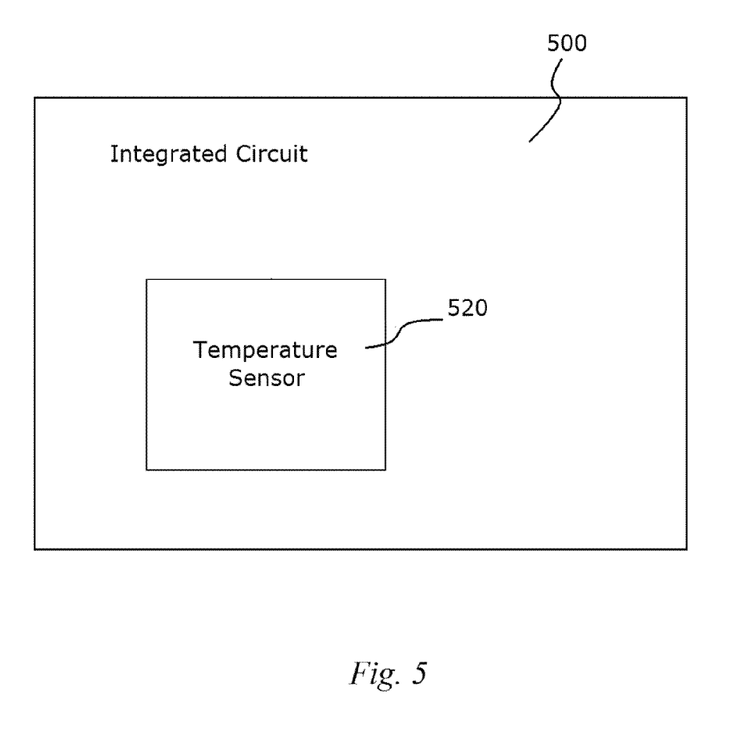
FIG. 5 shows a integrated with a embedded temperature sensor of the present invention.

FIG. 5 is a block diagram of an temperature sensor 520 of the present invention located within a integrated circuit 520. The temperature sensor 520 is embedded in the die of the exemplary integrated circuit 500 to sense the die temperature. More over, those skilled in the art can recognize that more than one temperature sensor can be included in the integrated circuit 500 to measure the temperature of different die area.

Figure 6:
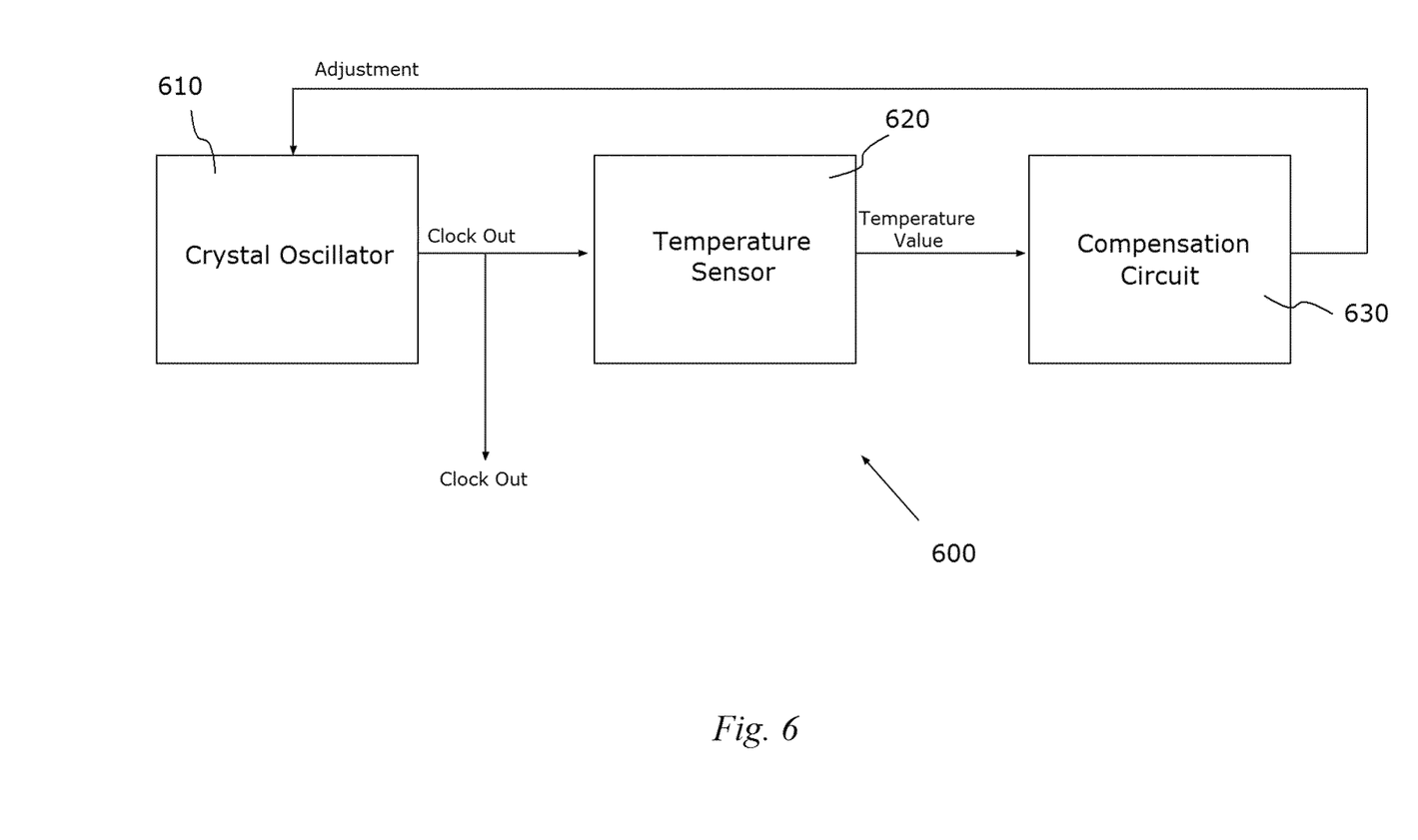
FIG. 6 shows a block diagram of one embodiment of implementing a temperature sensor of the present invention into a temperature compensated crystal oscillator.

FIG. 6 is a block diagram of a temperature compensated crystal oscillator 600 that uses a temperature sensor 620 of the present invention. Referring to FIG. 6, the temperature compensated crystal oscillator 600 comprises a crystal oscillator 610, a temperature sensor 620 of the present invention and a compensation circuit 630. The crystal oscillator 610 provide the clock signal for the temperature sensor 620's control circuit in order to generate control signals. The temperature sensor 620 sends the temperature reading to the compensation circuit 630. The compensation circuit 630 then compensate the crystal oscillator 610 so the output frequency of the clock is more stable.

While the present invention has been described with reference to various embodiments, it will be understood that these embodiments are illustrative and that the scope of the present invention is not limited to them. It will be appreciated that various modifications, additions, combinations, substitutions, and alterations might be made by those skilled in the art without departing from the spirit and scope of the present invention. The invention should, therefore, be measured in terms of the following claims.

I claim:

1. A temperature sensor to sense a temperature comprising:
a control circuit configured to assert a start signal;
a pulse generating circuit for outputting a plurality of pulses,
wherein said pulse generating circuit comprises a delay circuit for controlling a pulse frequency of said plurality of pulses, a pulse width controlling circuit for controlling a pulse width of said plurality of pulses, a synchronizer with asynchronous clear configured to synchronize an output of said delay circuit,
an output of said pulse width controlling circuit is configured to clear said synchronizer,
wherein said delay circuit is configured to output said plurality of pulses,
wherein an output of said synchronizer is configured to control an input signal of said delay circuit,
wherein a pulse frequency of said plurality of pulses is at least 100 Hz,
wherein a pulse frequency of said plurality of pulses is so controlled to vary with temperature;
a counter circuit for generating a count value in response to said plurality of pulses generated by said pulse generating circuit at a approximately predetermined time after assertion of said start signal by said control circuit,
wherein said counter is coupled to an output of said pulse generating circuit,
wherein said count value generated by said counter circuit is so controlled to vary with temperature.

2. The temperature sensor of claim 1, wherein at least one of said delay circuit and said pulse width controlling circuit of said pulse generating circuit comprises a plurality of inverters.

3. The temperature sensor of claim 1, wherein at least one of said delay circuit and said pulse width controlling circuit of said pulse generating circuit comprises a repeating pattern of transistors.

4. The temperature sensor of claim 1, wherein said pulse width controlling circuit of said pulse generating circuit comprises at least one of a resistor and a capacitor.

5. The temperature sensor of claim 1, wherein said synchronizer of said pulse generating circuit comprises a D flip-flop.

6. A integrated circuit chip comprising a temperature sensor as claimed in claim 1.

7. A temperature compensated crystal oscillator comprising a temperature sensor as claimed in claim 1.

8. A temperature sensor to sense a temperature comprising:
a control circuit configured to assert a start signal and to assert a stop signal at a time after assertion of said start signal by said control circuit;
a pulse generating circuit for outputting a plurality of pulses,
wherein said pulse generating circuit comprises a delay circuit for controlling a pulse frequency of said plurality of pulses, a pulse width controlling circuit for controlling a pulse width of said plurality of pulses, a synchronizer with asynchronous clear configured to synchronize an output of said delay circuit,
wherein an output of said pulse width controlling circuit is configured to clear said synchronizer,
wherein said delay circuit is configured to output said plurality of pulses,
wherein an output of said synchronizer is configured to control an input signal of said delay circuit,
wherein said stop signal asserted by said control circuit is configured to clear said synchronizer,
wherein a pulse frequency of said plurality of pulses is at least 100 Hz,
wherein a pulse frequency of said plurality of pulses is so controlled to vary with temperature;
a counter circuit for generating a count value in response to said plurality of pulses generated by said pulse generating circuit at a approximately predetermined time after assertion of said start signal by said control circuit,
wherein said counter is coupled to an output of said pulse generating circuit,
wherein said count value generated by said counter circuit is so controlled to vary with temperature.

9. The temperature sensor of claim 8, wherein at least one of said delay circuit and said pulse width controlling circuit of said pulse generating circuit comprises a plurality of inverters.

10. The temperature sensor of claim 8, wherein at least one of said delay circuit and said pulse width controlling circuit of said pulse generating circuit comprises a repeating pattern of transistors.

11. The temperature sensor of claim 8, wherein said pulse width controlling circuit of said pulse generating circuit comprises at least one of a resistor and a capacitor.

12. The temperature sensor of claim 8, wherein said synchronizer of said pulse generating circuit comprises a D flip-flop.

13. A method for sensing temperature comprising the steps of:
a) providing the temperature sensor as claimed in claim 8;
b) passing a start signal;
c) upon assertion of said start signal by step a, generating a plurality of pulses, wherein the pulse frequency of said plurality of pulses is so controlled to vary with temperature;
d) measuring the number of pulses after assertion of said start signal by step b;
e) outputting a value representative of temperature based on the result of step d;
f) passing a stop signal to stop generating said plurality of pulses.

14. A integrated circuit chip comprising a temperature sensor as claimed in claim 8.

15. A temperature compensated crystal oscillator comprising a temperature sensor as claimed in claim 8.

16. A temperature sensor to sense a temperature comprising:
a control circuit configured to assert a start signal and to assert a stop signal at a time after assertion of said start signal by said control circuit;
a pulse generating circuit for outputting a plurality of pulses,
wherein said pulse generating circuit comprises a delay circuit for controlling a pulse frequency of said plurality of pulses, a pulse width controlling circuit for controlling a pulse width of said plurality of pulses, a synchronizer with asynchronous clear configured to synchronize an output of said delay circuit,
wherein an output of said pulse width controlling circuit is configured to clear said synchronizer,
wherein said delay circuit is configured to output said plurality of pulses,
wherein an output of said synchronizer is configured to control an input signal of said delay circuit,
wherein said stop signal asserted by said control circuit is configured to clear said synchronizer,
wherein a pulse frequency of said plurality of pulses is at least 100 Hz, wherein a pulse frequency of said plurality of pulses is so controlled to vary with temperature,
wherein at least one of said delay circuit and said pulse width controlling circuit of said pulse generating circuit comprises a plurality of inverters;
a counter circuit for generating a count value in response to said plurality of pulses generated by said pulse generating circuit at a approximately predetermined time after assertion of said start signal by said control circuit,
wherein said counter is coupled to an output of said pulse generating circuit,
wherein said count value generated by said counter circuit is so controlled to vary with temperature.

17. The temperature sensor of claim 16, wherein said synchronizer of said pulse generating circuit comprises a D flip-flop.

18. The temperature sensor of claim 16, wherein said pulse width controlling circuit of said pulse generating circuit comprises at least one of a resistor and a capacitor.

* * * * *